United States Patent
Gascon Fora et al.

(10) Patent No.: US 10,605,656 B2
(45) Date of Patent: Mar. 31, 2020

(54) SUMMATION FOR MULTI-CHANNEL PHOTOMULTIPLIER ARRAY SIGNALS

(71) Applicant: UNIVERSITAT DE BARCELONA, Barcelona (ES)

(72) Inventors: David Gascon Fora, Barcelona (ES); Sergio Gómez Fernández, Barcelona (ES); Joan Mauricio Ferré, Barcelona (ES)

(73) Assignee: UNIVERSITAT DE BARCELONA, Barcelona (ES)

( * ) Notice: Subject to any disclaimer, the term of this patent is extended or adjusted under 35 U.S.C. 154(b) by 190 days.

(21) Appl. No.: 15/764,304

(22) PCT Filed: Sep. 29, 2016

(86) PCT No.: PCT/EP2016/073307
§ 371 (c)(1),
(2) Date: Mar. 28, 2018

(87) PCT Pub. No.: WO2017/055477
PCT Pub. Date: Apr. 6, 2017

(65) Prior Publication Data
US 2018/0283938 A1    Oct. 4, 2018

(30) Foreign Application Priority Data

Oct. 2, 2015 (EP) .................................... 15382478

(51) Int. Cl.
*G01J 1/44* (2006.01)
*G05F 3/26* (2006.01)
*H03F 3/45* (2006.01)

(52) U.S. Cl.
CPC ............... *G01J 1/44* (2013.01); *G05F 3/26* (2013.01); *G05F 3/265* (2013.01);
(Continued)

(58) Field of Classification Search
CPC ............... G01J 1/44; G05F 3/26; G05F 3/265
(Continued)

(56) References Cited

U.S. PATENT DOCUMENTS 7,098,434 B2 * 8/2006 Streun .................... G01T 1/208
250/207
2014/0029715 A1    1/2014 Hansen et al.

FOREIGN PATENT DOCUMENTS

CN    201775635 U    3/2011
EP    2746817 A1    6/2014
(Continued)

OTHER PUBLICATIONS

International Search Report and Written Opinion dated Jan. 3, 2017 for International Application No. PCT/EP2016/073307, 15 pages.

*Primary Examiner* — Kevin K Pyo
(74) *Attorney, Agent, or Firm* — Squire Patton Boggs (US) LLP

(57) ABSTRACT

A summation circuit (1) for summing one or more signals received from a photomultiplier array is proposed. The summation circuit comprises one or more readout circuits (5) coupleable to one or more photodiodes of the photomultiplier array (2), respectively, and a channel summing module (50), coupled at one or more outputs of the one or more readout circuits, respectively, to sum the one or more signals provided by the one or more readout circuits. The one or more readout circuits are coupleable to the photodiode of the photomultiplier array. Each readout circuit (5) comprises one or more coefficient controllers (C1, C2) for controlling multiplying coefficients of the received signal. The coefficient controllers may be placed at the input and/or at the output of the readout circuits (5).

12 Claims, 7 Drawing Sheets

(52) U.S. Cl.
CPC .............. *G01J 2001/4413* (2013.01); *G01J 2001/4446* (2013.01); *H03F 3/45076* (2013.01)

(58) Field of Classification Search
USPC .......................................... 250/214 VT, 207
See application file for complete search history.

(56) References Cited

FOREIGN PATENT DOCUMENTS

| | | |
|---|---|---|
| EP | 2816800 A1 | 12/2014 |
| GB | 2231740 A | 11/1990 |
| WO | WO 2014/096143 A1 | 6/2014 |

\* cited by examiner

SUMMATION FOR MULTI-CHANNEL PHOTOMULTIPLIER ARRAY SIGNALS

The present invention relates to summation configurations for multi-channel photomultiplier array signals.

BACKGROUND ART

Many circuits are known in the art for reading ultra sensitive photosensors such as photomultiplier tubes (PMT) or silicon photomultipliers (SiPM). PCT/EP2013/077305 discloses readout circuits for multi-channel photomultiplier common cathode arrays. The readout circuits are connectable to the anode of the photodiodes of the photomultiplier arrays. Using a feedback circuit, the resulting readout circuit is a wideband readout circuit with improved resolution of timing and energy measurements. However, the circuit disclosed in PCT/EP2013/077305 does not provide summation of the signals of the multiple channels.

It is desirable to provide a summation circuit for photomultiplier arrays.

SUMMARY OF THE INVENTION

The terms "base", "collector", and "emitter" are typically used to describe the terminals of a bipolar junction transistor. Accordingly, the terms "gate", "source", and "drain" are typically used to describe the terminals of a field-effect transistor (FET). For the purposes of this disclosure the terminal terms may be used interchangeably without implying the type of amplifier used unless explicitly stated.

By simply connecting the outputs of the readout circuits described in PCT/EP2013/077305 it is possible to sum the received signals If a single photodiode is not functioning properly the result may be erroneous. And even if all function properly it will lead to a mere addition of the received signals.

However, this may also cause errors in case of gain non-uniformity between single photodiodes. To solve the problem a conditional summation is proposed.

In a first aspect of the invention a summation circuit for summing one or more signals received from a photomultiplier array is disclosed. The summation circuit comprises: one or more readout circuits coupleable to one or more photodiodes of the photomultiplier array, respectively, and a channel summing module, coupled at one or more outputs of the readout circuit. The channel summing module is configured to sum the one or more signals provided by the one or more readout circuits. Each readout circuit comprises one or more coefficient controllers for controlling multiplying coefficients of the received signal and at least one channel circuit, coupled to the one or more coefficient controllers. The channel circuit comprises a first resistor, coupleable at one end to the anode of the photodiode, an input stage, coupled to the other end of the first resistor, and a feedback circuit. The input stage comprises a current mirror configuration having at least a first gain path. The first gain path comprises an input branch with at least one input amplifier, and a first output branch with at least one mirror amplifier having its base and emitter connected to the base and emitter of the input amplifier of the input branch. The high frequency feedback circuit is arranged between the base of the input amplifier and the input of the current mirror configuration.

The summation circuit according to the disclosure allows conditioned addition of photomultiplier signals that have been read with the readout circuits. It may provide non-linear response. The diode transfer function may provide non-linear dynamic range compression. The controlled summation allows correcting any gain non-uniformities between photodiodes that may not be corrected after summation.

In some examples the channel summing module may comprise one or more summing elements. The summing elements may be arranged in parallel or may be coupled to different outputs of the readout circuit. Each summing element may comprise a saturation control element and one or more resistors coupled in parallel configuration. Each summing element may provide a different gain and may be selectable to provide different summation results or multiple summation results.

In some examples the saturation control element may comprise a summing amplifier having a collector and a base coupled to the power supply and an emitter coupled to the one or more outputs of the one or more readout circuits, respectively.

In some examples, the one or more resistors may be selectable to control an overall multiplying coefficient of a summation result.

In some examples, the one or more coefficient controllers may comprise a current switch coupled to the output of at least one channel circuit. That way, one or more channels may be selectably disconnected from the summing module. Therefore, when the switch disconnects a circuit, the coefficient of the disconnected channel may be considered equal to zero.

In some examples, the current switch may comprise one or more common base transistors and an Operational Transconductance Amplifier (OTA). A noninverting input of the OTA may be coupled to an anode reference voltage, an inverting input of the OTA may be coupled to the input of the current switch and an output of the OTA may be coupled to one or more selectors. Each of the one or more selectors may be coupled to one of the one or more bases of the one or more common base transistors, respectively. Each of the emitters of the one or more common base transistors may be coupled to the output of the one or more gain paths of the current mirror. It may therefore adjust the coefficients by dividing the current of the current mirror. Furthermore, it may allow connection to a different summing node, hence it may modify the individual coefficients or the multiplying coefficient. If several transistors are connected to the input the current may be divided, providing a way to control the value of the coefficient.

In some examples, the one or more coefficient controllers may comprise an anode voltage controller. The anode voltage controller may be coupled between the anode of the at least one photodiode of the photomultiplier array and to the first resistor (Rd) of the channel circuit. The adjustment of the anode voltage may be used to change the gain or the photon detection efficiency of the photomultiplier, and therefore the gain of each channel. In addition it provides a mechanism to "switch off" individual photodiodes ("pixels") of the photomultiplier array. This allows to prevent full array failure in case of a defective pixel and to prevent excessive consumption in case of a high rate on a pixel because of a high dark count rate or because of excessive illumination (e.g. moon observation in Cherenkov Telescopes).

In some examples, the anode voltage controller may comprise an inverter, a first FET and a second FET. The inverter may have an input and an output. The first FET may have a collector coupled to a reference voltage, an emitter coupled to the anode of the at least one photodiode and a base coupled to the output of the inverter. The second FET may have a collector coupled to the first resistor (Rd), an emitter coupled to the anode of the at least one photodiode and a base coupled to the input of the inverter. The first FET may be a high voltage FET and may be used to connect the anode of the photomultiplier to the reference voltage. This voltage needs to be lower than the breakdown voltage of the photodiode in order to "switch-off" any pixel. The second FET may be another high voltage FET to isolate input stage behaving as a switch element when conducting.

In some examples, the high frequency feedback circuit may comprise at least a first amplifier and a second amplifier. The first amplifier may have a collector coupled to a power supply voltage, a base coupled to a collector of the second amplifier and an emitter coupled to the base of the input amplifier and to earth via a current source. The second amplifier may have a base coupled to earth via a first capacitor and an emitter coupled to the input of the current mirror configuration.

In some examples, the summation circuit may further comprise a low frequency feedback circuit coupled between the base of the second amplifier and the input of the input branch. The low frequency feedback circuit may comprise an OTA having a positive input coupled to a voltage supply reference, a negative input coupled to the input of the input branch and an output coupled to the base of the second amplifier.

Summation circuits according to the examples disclosed herein may be used for various types of photo multiplier arrays, for example for SiPM.

Additional objects, advantages and features of embodiments of the invention will become apparent to those skilled in the art upon examination of the description, or may be learned by practice of the invention.

BRIEF DESCRIPTION OF THE DRAWINGS

Particular embodiments of the present invention will be described in the following by way of non-limiting examples, with reference to the appended drawings, in which.

DETAILED DESCRIPTION OF EMBODIMENTS

Figure 1:
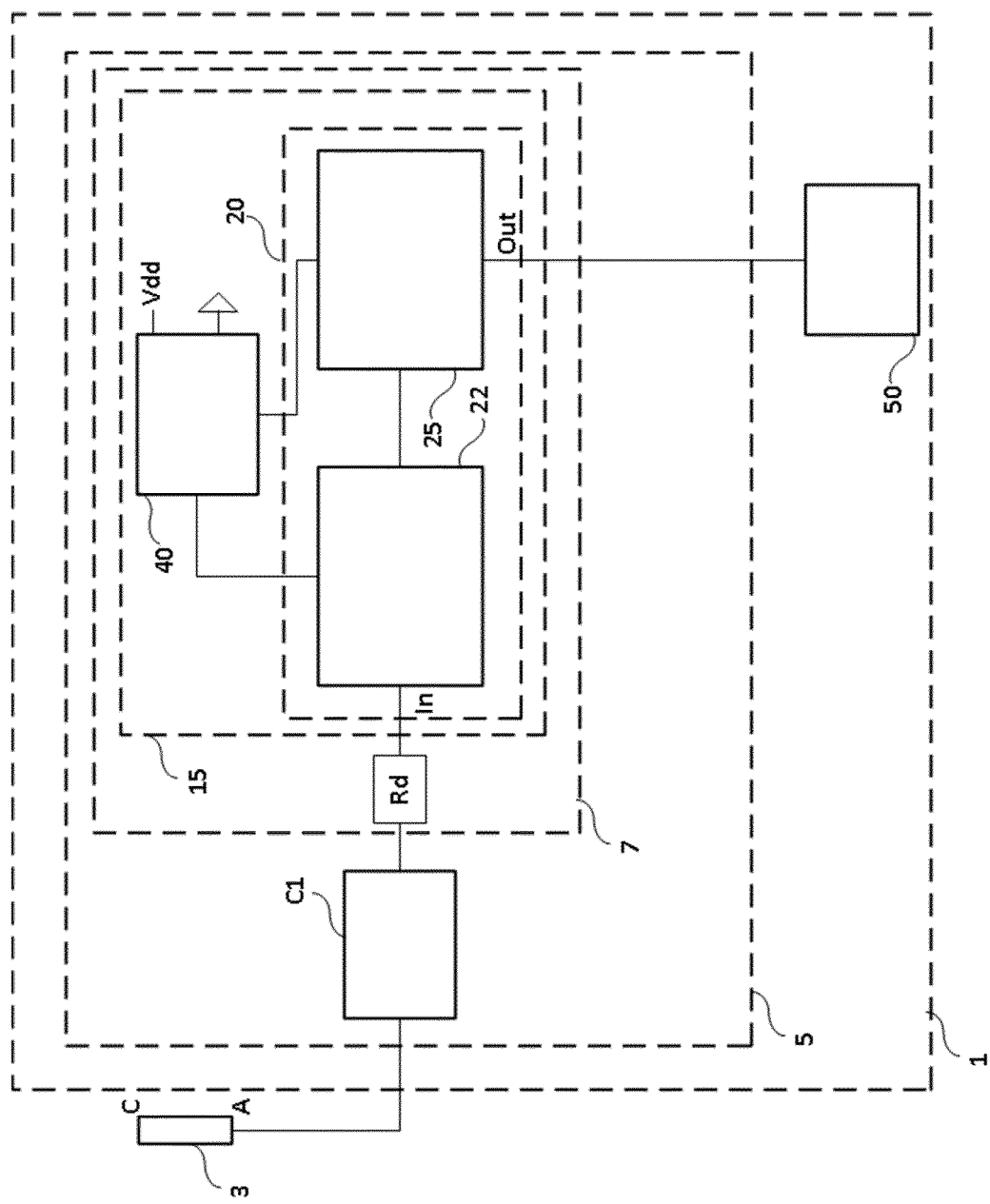
FIG. 1 is a block diagram of a summation circuit with a coefficient controller at the input, according to an example.

FIG. 1 is a block diagram of a summation circuit with a coefficient controller at the input, according to an example. Summation circuit 1 comprises readout circuit 5 and channel summing module 50. Readout circuit 5 comprises coefficient controller C1 and channel circuit 7. An input of coefficient controller C1 is coupled at one end to the anode A of photodiode 3 of a common cathode photomultiplier array. Photodiode 3 is a photodiode having an anode A and a cathode C. Channel circuit 7 comprises resistor Rd and input stage 15. Input stage 15 comprises current mirror circuit 20 and feedback circuit 40.

Resistor Rd is coupled at one end to an output of coefficient controller C1. The other end of resistor Rd is coupled, to an input (In) of current mirror circuit 20 of input stage 15. Current mirror circuit 20 shown in FIG. 1 comprises input branch 22 and output branch 25. An input of input branch 22 is the input of current mirror circuit 20. Input branch 22 and output branch 25 constitute a first gain path, having an output Out coupled to channel summing module 50. Input branch 22 comprises at least an input amplifier and the output branch comprises at least a mirror amplifier. However, any number of gain paths is possible with this configuration. Current mirror circuit 20 may be either a simple current mirror or a cascode current mirror. A current mirror is a circuit having multiple transistors connected in parallel, with their gates connected together and their sources connected to the same voltage.

Figure 2:
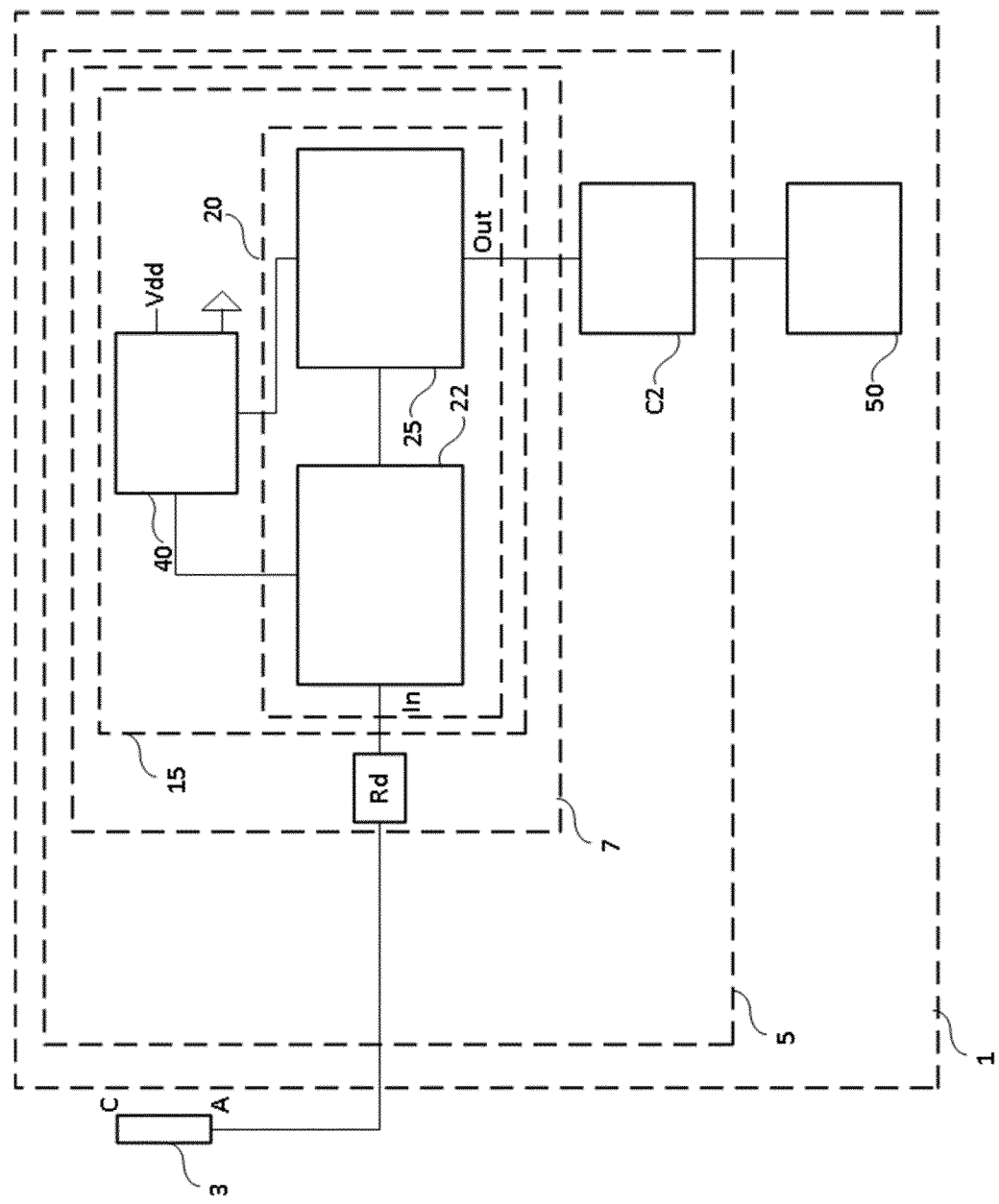
FIG. 2 is a block diagram of a summation circuit with a coefficient controller at the output, according to an example.

FIG. 2 is a block diagram of a summation circuit with a coefficient controller at the output, according to an example. In this example, one end of the resistor Rd of the channel circuit 7 is coupled to the anode of photodiode 3 of a common cathode photomultiplier array. Therefore, there is no coefficient controller at the input. However, readout circuit 5 comprises coefficient controller C2 having an input coupled to the output of output branch 25 and an output coupled to channel summing module 50.

Figure 3:
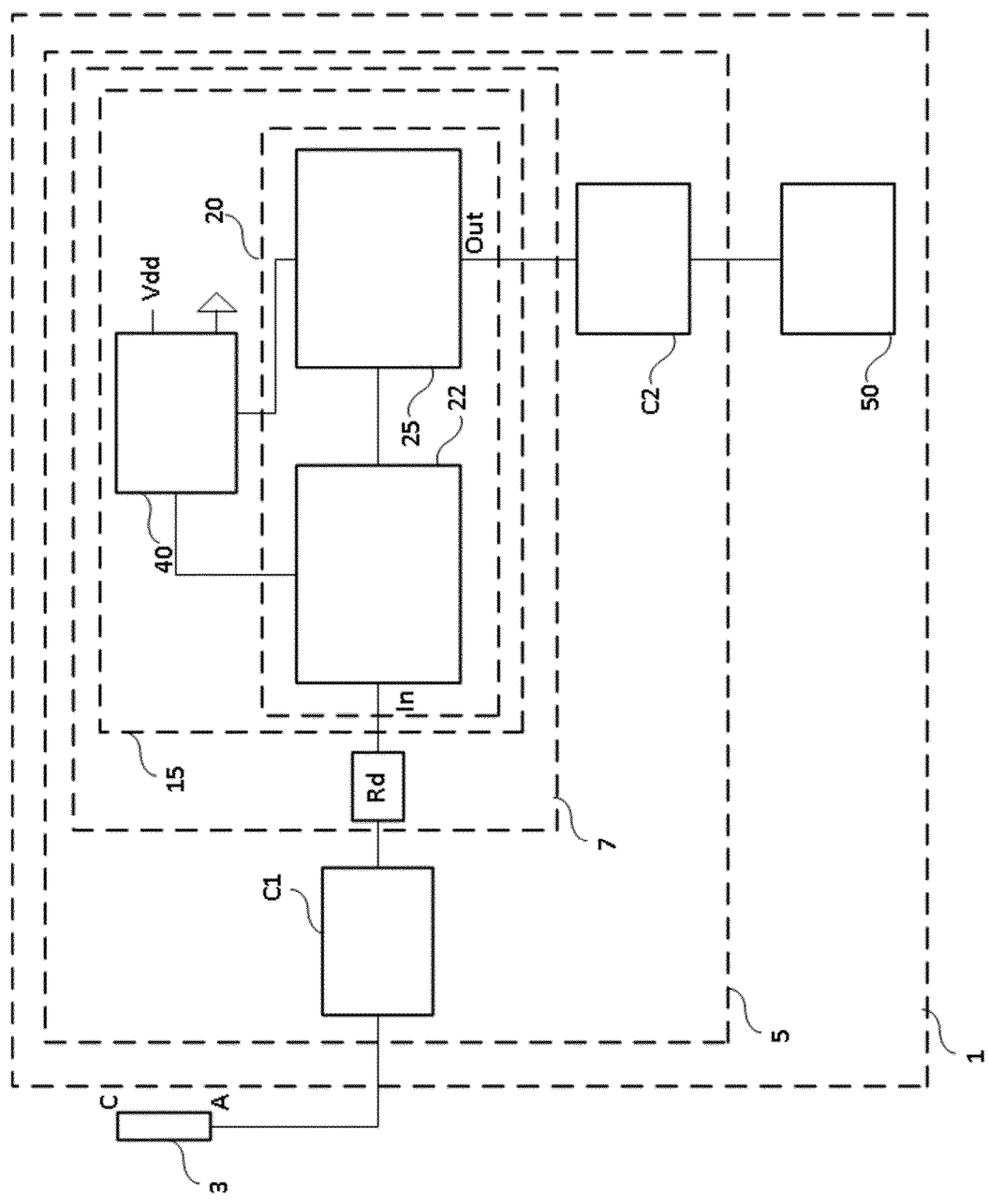
FIG. 3 is a block diagram of a summation circuit with a coefficient controller at the input and another at the output, according to an example.

FIG. 3 is a block diagram of a summation circuit with a coefficient controller at the input and another at the output, according to an example. In this example, which may be considered a superposition of the examples of FIG. 1 and FIG. 2, the readout circuit 5 comprises two coefficient controllers C1 and C2. Coefficient controller C1 is coupled at the input of the readout circuit 5, as in FIG. 1 and coefficient controller C2 is coupled at the output of the readout circuit 5 to channel summing module 50, as in FIG. 2.

It is noted that in other implementations, the photomultiplier arrays may be common anode arrays. In that case, the readout circuit would be coupled to the cathode of the photodiode of the photomultiplier array. The readout circuit would then be a complementary circuit to the one used for common cathode readout. That is, it would then comprise complementary elements (transistors). For example, it would require PMOS transistors instead of NMOS, NMOS instead of PMOS, NPN bipolar transistors instead of PNP, and so on.

Figure 4:
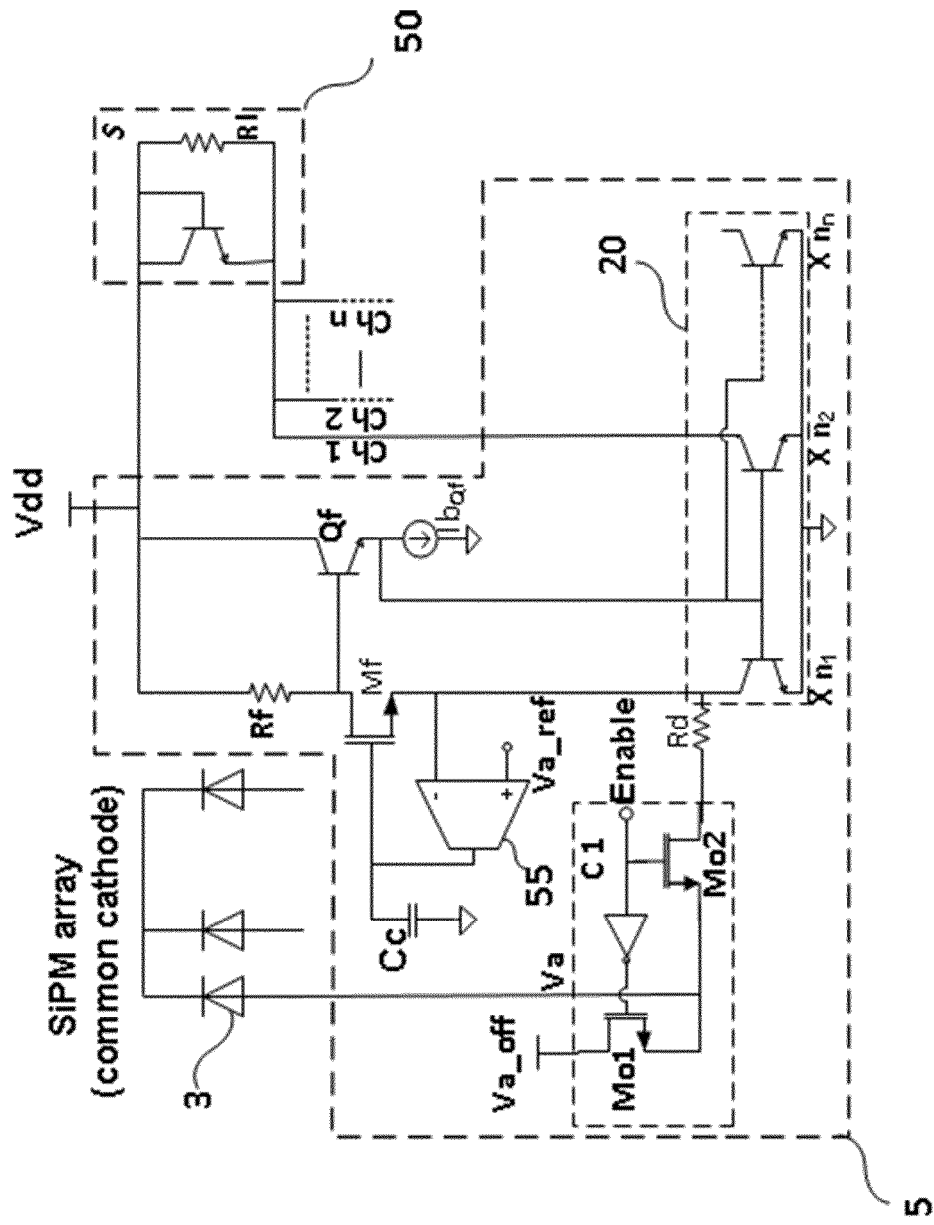
FIG. 4 is a circuit level of a summation circuit with a coefficient controller at the input, according to an example.

FIG. 4 is a circuit level of a summation circuit with a coefficient controller at the input, according to an example. The summation circuit of FIG. 4 comprises readout circuit 5 and channel summing module 50. Readout circuit 5 comprises coefficient controller C1 coupled between the anode of photodiode 3 of common cathode SiPM array and resistor Rd. Coefficient controller C1 is an anode voltage controller. It comprises an inverter, having an input and an output, a first high voltage FET Mo1 and a second high voltage FET Mo2. The high voltage FET Mo1 has a collector coupled to a reference voltage Va_off, an emitter coupled to the anode of the photodiode and a base coupled to the output of the inverter. The second high voltage FET Mo2 has a collector coupled to the first resistor (Rd), an emitter coupled to the anode of the at least one photodiode and a base coupled to the input of the inverter. When the enable signal is received, the FET Mo1 does not conduct and the photodiode signal reaches the input stage 15. The input stage 15 comprises current mirror 20, a high frequency (HF)

feedback circuit and a low frequency (LF) feedback circuit. Current mirror 20 comprises an input amplifier $Xn_1$ and n−1 output amplifiers $Xn_2$ to $Xn_n$. The input amplifier forms n−1 gain paths with each output amplifier. In FIG. 4, current mirror 20 is a current amplifier implemented with Bipolar Junction Transistors (BJTs) and more specifically with Heterojunction Bipolar Transistors (HBTs). However, FETs could be used according to the requirements of a specific application.

HF feedback circuit is formed by amplifiers $Xn_1$, Mf and Qf. LF feedback circuit is formed by OTA 55 and amplifier Mf. In the HF feedback circuit, emitter of amplifier Mf is coupled to other end of resistor Rd. Collector of amplifier Mf is coupled to base of transistor Qf and to one end of resistor Rf. Emitter of transistor Qf is coupled to the base of $Xn_1$ and to earth via current source IbQf. Collector of transistor Qf and the other end of resistor Rf are coupled to Vdd. The HF feedback circuit acts as a shunt feedback via transistor Mf. It introduces negative feedback to stabilize voltage at Va node. Of particular importance is the introduction of transistor Qf that acts as a voltage follower to increase the voltage range of Va. This is of importance especially in cases where the ability to modify Va with 1 V range is required. Such functionality is enabled with the introduction of transistor Qf in the HF loop circuit.

The second feedback, the LF loop circuit, is added to control the DC and LF value of Va. Transistor Mf is part both of the HF and LF loop circuits. Transistor Mf is a common base amplifier that senses voltage variations in Va, those variations are converted to a current signal. The current signal is converted to voltage with resistor Rf. The small signal voltage variation is transmitted by transistor Qf emitter follower to the base of the cascode transistor of the current mirror. Transistor Mf acts as a common emitter amplifier that closes the negative feedback loop.

LF loop circuit is a negative feedback loop via a high gain and low bandwidth OTA 55. It may allow accurate control of Va voltage at DC/LF. The feedback loop of the LF loop circuit is closed by transistor Mf. This virtual short circuit makes Va approximately equal to Va_ref. Va_ref may be set accurately (by a stable voltage reference and programmed by a Digital-to-Analog Converter (DAC)), hence Va may be known and well controlled.

A first effect of this feedback on the input stage is that voltage at Va node may be accurately controlled. Without the LF loop circuit, the voltage at node Va would be the voltage at Mf gate minus the gate-source voltage of Mf. Gate-source Voltage of Mf may change a lot with temperature and process variations and also may depend on the circuit operating point.

A second effect of this feedback may be seen at the final output. In a SiPM array it is important to control the voltage of each SiPM anode (Va) since, typically, cathode is common (Vc) for all. Therefore, it is very important to control the Vc−Va=Vca voltage since operating parameters of the SiPM such as gain or photodetection efficiency depend on the overvoltage Vov, where Vov=Vca−Vb, and Vb is the breakdown voltage of the SiPM. Vb is a parameter with significant tolerances, i.e. it changes from element to element of the array (from SiPM to SiPM). As a result, adjusting the Vca allows equalization of Vov for all the SiPMS. This translates in more uniform response which in turn provides better resolution.

The output of $Xn_2$, which is the output of the first gain stage (ch1) is coupled to channel summing module 50. In the example of FIG. 4, channel summing module 50 comprises a saturation control circuit that provides non-linear response. It comprises a summing amplifier having an emitter coupled to the output of the first gain stage and a base and collector coupled to Vdd. It further comprises a resistor RI coupled in parallel between emitter and collector of the summing amplifier. The diode transfer function may provide non-linear dynamic range compression. It is noted that in other implementations, the summing module 50 may comprise multiple summing elements. Each summing element may have a summing amplifier and one or more resistors coupled in parallel. Each summing element may then be used to provide different gains.

In operation each photodetector pixel may be sensed by the corresponding readout circuit 5 and then they may be summed at the summation element 50.

The mathematical operation of the circuit may be described as:

$$\text{Sum} = S(k_1 ch_1 + k_i ch_i + \ldots k_n ch_n) \qquad (1)$$

The coefficients $k_i$ may be controlled, in the example of FIG. 4, by the coefficient controller C1. The coefficient S may be controlled at the summation element 50 by the resistor $R_i$.

Figure 5:
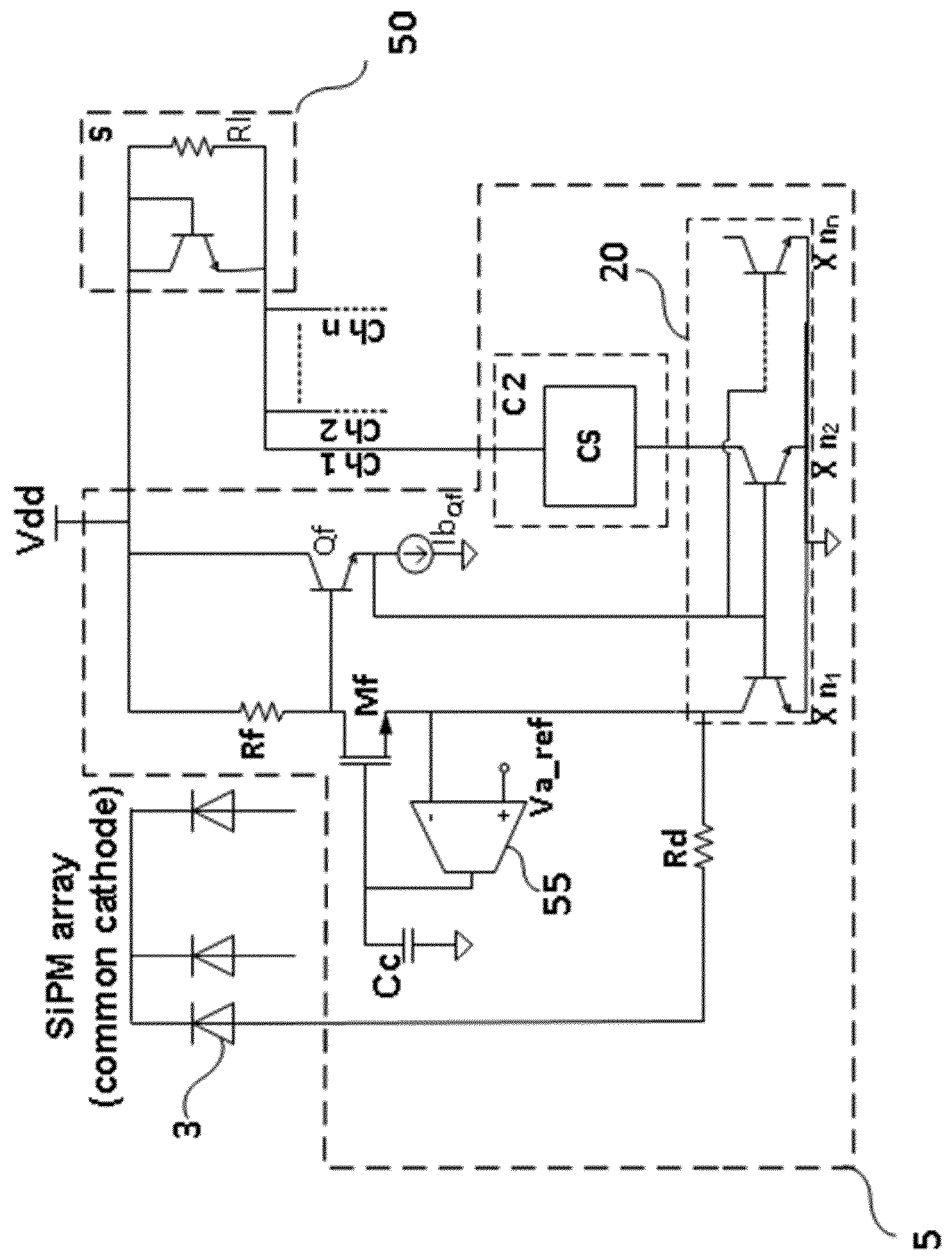
FIG. 5 is a circuit level of a summation circuit with a coefficient controller at the output, according to an example.

FIG. 5 is a circuit level of a summation circuit with a coefficient controller at the output, according to an example. The anode of photodiode 3 of common cathode SiPM array is coupled to resistor Rd because there is no coefficient controller C1 as in FIG. 4. However, a coefficient controller C2 is coupled at the output of first gain path of current mirror circuit 20. Coefficient controller C2 is a current switch. It may disconnect the channel $ch_1$ from the summing block, so it is equivalent to setting $k_1=0$. An implementation of the current switch shall be discussed with reference to FIGS. 7a and 7b below.

Figure 6:
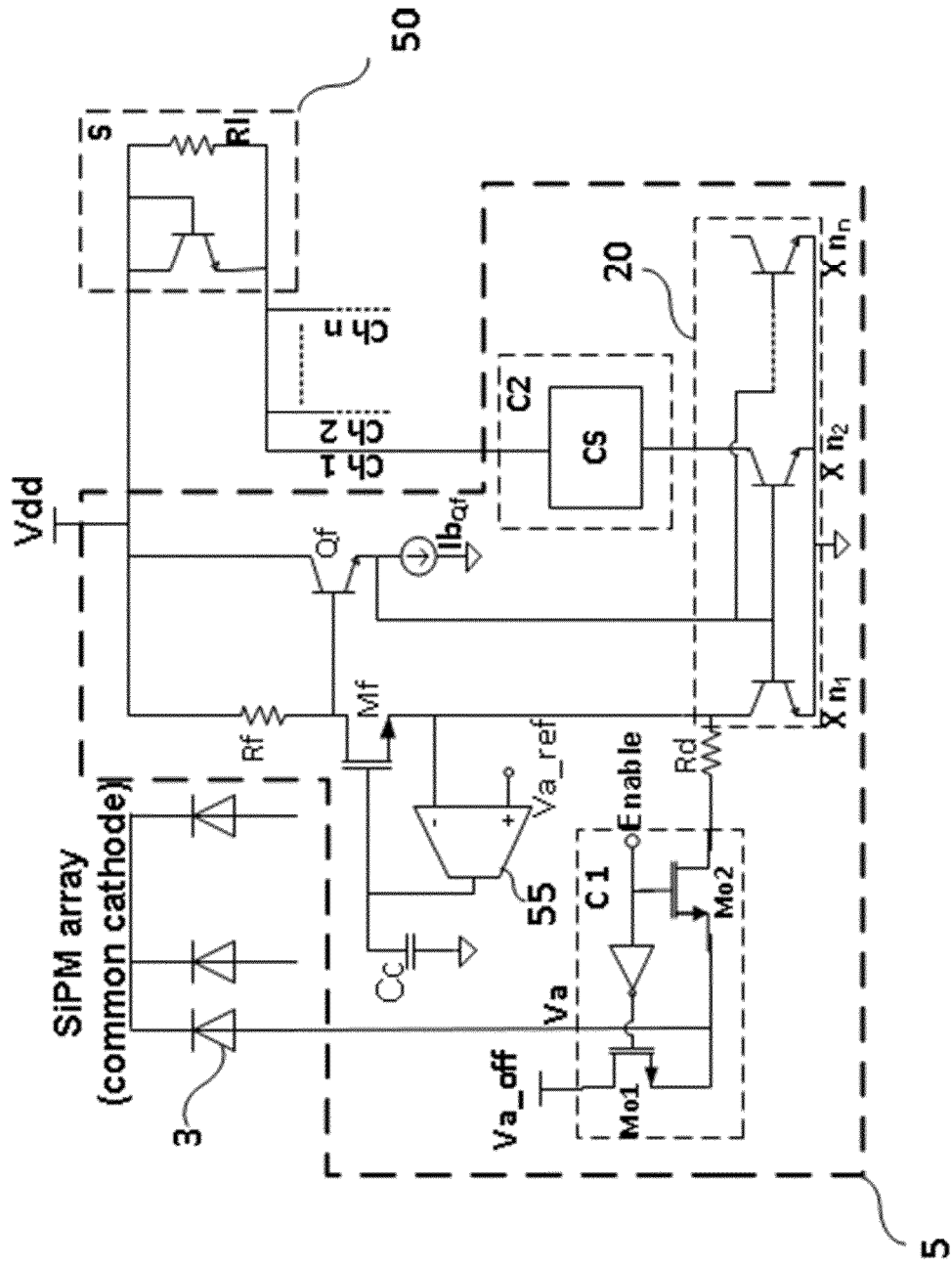
FIG. 6 is a circuit level of a summation circuit with a coefficient controller at the input and another at the output, according to an example.

FIG. 6 is a circuit level of a summation circuit with a coefficient controller at the input and another at the output, according to an example. It may be considered a superposition of the examples of FIG. 4 and FIG. 5. The readout circuit 5 comprises two coefficient controllers C1 and C2. Coefficient controller C1 is coupled at the input of the readout circuit 5, as in FIG. 4 and coefficient controller C2 is coupled at the output of the readout circuit 5 to channel summing module 50, as in FIG. 5.

Figure 7:
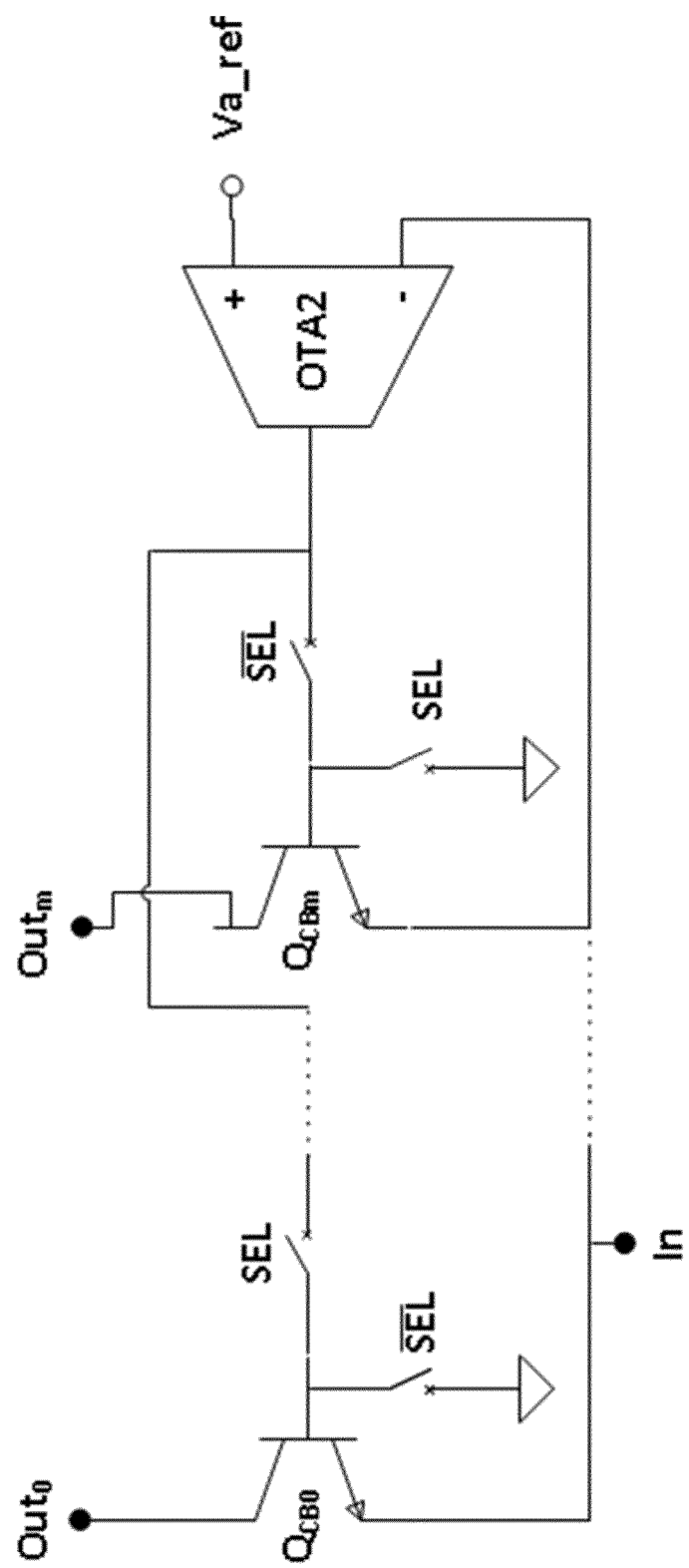
FIG. 7 shows a particular implementation of a current switch according to an example.

FIG. 7 shows a particular implementation of a current switch according to an example. The current switch of FIG. 7 acts as an active cascode for the input current mirror. It consists of common gate/base transistors $Q_{CB}$ ($Q_{CB0}$−$Q_{CBm}$) and Operational Transconductance Amplifier OTA2. The active cascode element sets the drain/collector voltage of each mirror slave to the same drain/collector voltage (Va) of the input transistor. This allows minimizing channel modulation errors (nonlinearity). Moreover, this is a low voltage configuration. The $Q_{CBi}$ transistor connected to the output of OTA2 works as a current buffer of the input current. The output $out_i$ may be disabled by connecting the base of $Q_{CBi}$ transistor to ground. In that case the coefficient $k_i=0$. If several $Q_{CBi}$ transistors are connected to the input the current may be divided, providing a way to further control the value of $k_i$.

Although only a number of particular embodiments and examples of the invention have been disclosed herein, it will be understood by those skilled in the art that other alternative embodiments and/or uses of the invention and obvious modifications and equivalents thereof are possible. Furthermore, the present invention covers all possible combinations of the particular embodiments described. Reference signs related to drawings and placed in parentheses in a claim, are solely for attempting to increase the intelligibility of the claim, and shall not be construed as limiting the scope of the claim. Thus, the scope of the present invention should not be limited by particular embodiments, but should be determined only by a fair reading of the claims that follow.

The invention claimed is:

1. A summation circuit for summing two or more signals received from a photomultiplier array, comprising:
two or more readout circuits configured for being coupled to two or more photodiodes of the photomultiplier array respectively, and
a channel summing module, coupled at one or more outputs of the readout circuits, respectively, configured to sum the two or more signals provided by the readout circuits,
each readout circuit comprising:
one or more coefficient controllers for controlling multiplying coefficients of the received signal; and
at least one channel circuit, coupled to the one or more coefficient controllers, the channel circuit comprising:
a first resistor configured for being coupled at one end to the anode of the photodiode, and
an input stage, coupled to the other end of the first resistor, the input stage comprising:
a current mirror configuration having at least a first gain path, wherein the first gain path comprises:
an input branch with at least one input amplifier, and
a first output branch with at least one mirror amplifier having its base and emitter connected to the base and emitter of the input amplifier of the input branch; and
a feedback circuit arranged between the base of the input amplifier and the input of the current mirror configuration,
wherein the one or more coefficient controllers comprises a current switch coupled to the output of the at least one channel circuit,
wherein the current switch comprises one or more common base transistors and an Operational Transconductance Amplifier (OTA2), wherein a noninverting input of the OTA2 is coupled the anode reference voltage, an inverting input of the OTA2 is coupled to the input of the current switch and an output of the OTA2 is coupled to one or more selectors, each of the one or more selectors being coupled to one of the one or more bases of the one or more common base transistors, respectively.

2. The summation circuit according to claim 1, wherein the one or more coefficient controllers comprises an anode voltage controller, coupled between the anode of the photodiode and the first resistor, of the channel circuit.

3. The summation circuit according to claim 2, wherein the anode voltage controller comprises:
an inverter, having an input and an output;
a first FET having a collector coupled to a reference voltage, an emitter coupled to the anode of the at least one photodiode and a base coupled to the output of the inverter;
a second FET, having a collector coupled to the first resistor (Rd), an emitter coupled to the anode of the at least one photodiode and a base coupled to the input of the inverter.

4. A summation circuit for summing two or more signals received from a photomultiplier array, comprising:

two or more readout circuits configured for being coupled to two or more photodiodes of the photomultiplier array respectively, and
a channel summing module, coupled at one or more outputs of the readout circuits, respectively, configured to sum the two or more signals provided by the readout circuits,
each readout circuit comprising:
one or more coefficient controllers for controlling multiplying coefficients of the received signal; and
at least one channel circuit, coupled to the one or more coefficient controllers, the channel circuit comprising:
a first resistor configured for being coupled at one end to the anode of the photodiode, and
an input stage coupled to the other end of the first resistor, the input stage comprising:
a current mirror configuration having at least a first gain path, wherein the first gain path comprises:
an input branch with at least one input amplifier, and
a first output branch with at least one mirror amplifier having its base and emitter connected to the base and emitter of the input amplifier of the input branch; and
a feedback circuit arranged between the base of the input amplifier and the input of the current mirror configuration,
wherein the one or more coefficient controllers comprises an anode voltage controller coupled between the anode of the photodiode and the first resistor of the channel circuit.

5. The summation circuit according to claim 4, wherein the anode voltage controller comprises:
an inverter, having an input and an output;
a first FET having a collector coupled to a reference voltage, an emitter coupled to the anode of the at least one photodiode and a base coupled to the output of the inverter;
a second FET having a collector coupled to the first resistor, an emitter coupled to the anode of the at least one photodiode and a base coupled to the input of the inverter.

6. The summation circuit according to claim 1, wherein the channel summing module comprises one or more summing elements, each summing element having a saturation control element and one or more resistors coupled in a parallel configuration.

7. The summation circuit according to claim 6, wherein the saturation control element comprises a summing amplifier having a collector and a base coupled to the power supply and an emitter coupled to the one or more outputs of the readout circuit.

8. The summation circuit according to claim 6, wherein the one or more resistors are selectable to control an overall multiplying coefficient of a summation result.

9. The summation circuit according to claim 1, wherein the feedback circuit comprises a high frequency feedback circuit comprising at least a first amplifier and a second amplifier,
the first amplifier having a collector coupled to a power supply voltage, a base coupled to a collector of the second amplifier and an emitter coupled to the base of the input amplifier and to earth via a current source,
the second amplifier having a base coupled to earth via a first capacitor and an emitter coupled to the input of the current mirror configuration.

10. The summation circuit according to claim 9, wherein the feedback circuit further comprises a low frequency feedback circuit coupled between the base of the second amplifier and the input of the input branch.

11. The summation circuit according to claim 10, wherein the low frequency feedback circuit comprises an Operational Transconductance Amplifier (OTA) having a positive input coupled to a voltage supply reference, a negative input coupled to the input of the input branch and an output coupled to the base of the second amplifier.

12. The summation circuit according to claim 1, wherein the summation circuit is configured to receive signals from a silicon photomultiplier array (SiPM).

* * * * *